(12) United States Patent
Horne et al.

(10) Patent No.: US 6,181,596 B1
(45) Date of Patent: Jan. 30, 2001

(54) METHOD AND APPARATUS FOR A RAM CIRCUIT HAVING N-NARY OUTPUT INTERFACE

(75) Inventors: Stephen C. Horne; Michael R. Seningen; James S. Blomgren, all of Austin, TX (US)

(73) Assignee: Intrinsity, Inc., Austin, TX (US)

( * ) Notice: Under 35 U.S.C. 154(b), the term of this patent shall be extended for 0 days.

(21) Appl. No.: 09/458,766

(22) Filed: Dec. 10, 1999

Related U.S. Application Data

(62) Division of application No. 09/150,258, filed on Sep. 9, 1998, now Pat. No. 6,046,931.
(60) Provisional application No. 60/069,250, filed on Dec. 11, 1997.

(51) Int. Cl.[7] ................................................ G11C 11/56
(52) U.S. Cl. ................................................... 365/168
(58) Field of Search .................................... 365/154, 156, 365/168, 203, 205, 207, 208, 190, 230.06, 230.08, 189.05, 189.08

(56) References Cited

U.S. PATENT DOCUMENTS

| | | |
|---|---|---|
| 5,208,489 | 5/1993 | Houston . |
| 5,208,490 | 5/1993 | Yetter . |
| 5,424,734 | 6/1995 | Hirahara et al. . |
| 5,524,088 | 6/1996 | Yoshida . |
| 5,640,108 | 6/1997 | Miller . |
| 5,808,932 * | 9/1998 | Irrinki et al. ........................ 365/168 |
| 5,867,423 * | 2/1999 | Kapoor et al. ...................... 365/168 |
| 6,046,931 * | 4/2000 | Horne et al. ........................ 365/168 |
| 6,069,836 * | 5/2000 | Horne et al. .................... 365/189.08 |

* cited by examiner

*Primary Examiner*—Trong Phan
(74) *Attorney, Agent, or Firm*—Booth & Wright, L.L.P.; Matthew J Booth; Karen S. Wright

(57) ABSTRACT

A memory device having a sense trigger coupled to receive an address when available, and to assert a sense trigger signal to the sense trigger when the sense trigger receives the address. The memory device also has an N-NARY, or 1-of-N, input logic gate that provides additional assurance that no more than one word line is asserted when an address is decoded. The memory device also has an N-NARY, or 1-of-N, output driver logic gate that provides an output signal directly useful for providing to another (N-NARY) 1-of-N logic gate.

10 Claims, 9 Drawing Sheets

METHOD AND APPARATUS FOR A RAM CIRCUIT HAVING N-NARY OUTPUT INTERFACE

This application claims the benefits of the earlier filed U.S. Provisional application Ser. No. 60/069,250, filed 11 Dec. 1997 (11.12.1997), which is incorporated by reference for all purposes into this application. Additionally, this application is a divisional of the earlier filed U.S. patent application Ser. No. 09/150,258, now U.S. Pat. No. 6,046,931, filed 09 Sep. 1998 (09.09.1998), entitled "Method and Apparatus for a RAM Circuit Having N-NARY Output Interface", which is incorporated by reference for all purposes into this specification.

BACKGROUND OF THE INVENTION

1. Field of the Invention

The present invention relates to electronic circuits, and more specifically to electronic circuits implementing RAM functionality.

2. Description of the Related Art

The active memory of modem computer systems relies heavily on the use of RAMs to perform active, volatile storage of both data and instructions. Static and dynamic RAMs are well known and well studied in the art. Dynamic memory is the workhorse of the main memory array of most modern computer systems, while static memory is generally used in high-speed memory caches, local to the primary processor.

The typical SRAM is composed of a large number of memory cells, each memory cell having a unique address within the memory. SRAM cells have typically been coupled to a pair of bit lines via a pair of word line transistors. When the word line signal has received a logical high signal assertion, data is exchanged between a pair of nodes internal to the SRAM cell and the pair of bit lines. The word line signal has generally been generated as a logical function of various bits of a received address. Depending on whether the operation is a read or a write, data is either transferred from the internal nodes of the RAM cell to the bit lines, or from the bit lines to the internal nodes of the RAM cell.

Sense amplifiers have typically been employed to increase the speed with which the bit line logic state changes (i.e., changes, in either voltages or currents, that represent transactions between logic states on the bit lines can be detected during reads). A sense amplifier has typically been constructed to detect small differences (i.e., the differential) in voltage or current between the bit lines of the bit line pair. The sense amplifier has typically contained a static CMOS transistor pair for each bit line with positive feedback. It drives the bit line with the higher logic state voltage to the positive rail and the bit line with the lower logic state to the negative rail.

However, even before input data arrives at the sense amplifier, small fluctuations between the bit lines may be detected. The fluctuations in the bit line may result from any of a variety of factors, including crosstalk from other memory cells and bit lines, electrical or switching noise, or other environmental factors. These fluctuations are overcome by the differential intentionally placed on the bit lines once the inputs arrive, but premature reading of the bit lines may inadvertently cause an erroneous measurement.

To reduce the chance of such an erroneous, premature reading, a delay circuit has typically been employed to delay the operation of the sense amplifier until the SRAM cell being read has had sufficient time to produce differential on the bit lines. The delay, typically originating from a clock edge, delays the triggering of the sense amplifier until the difference between the bit lines may be assumed to be caused by actual data from the RAM cell. The delay has sometimes been determined in a worse case scenario, i.e., to provide as much assurance as possible that the sense amplifier will not trigger early and thereby produce a false result. However, high performance SRAMs may incorporate some type of self-timing.

SUMMARY OF THE INVENTION

The present invention provides an improved RAM circuit through the use of N-NARY logic gates. The RAM circuit includes two columns of RAM cells, two pairs of bit lines, an N-NARY input logic circuit, a SENSE signal generation circuit (also referred to as a sense amplifier trigger circuit), two sense amplifiers, and an output driver circuit. One portion of the RAM circuit includes one of the columns of RAM cells, one of the pairs of bit lines, and one of the sense amplifiers. A second portion of the RAM circuit includes the second column of RAM cells, the second of the pairs of bit lines, and the second sense amplifier. Each of the RAM cells may be a six-transistor RAM cell, and together with a corresponding RAM cell in the other column forms a RAM cell pair that is driven by a common word line signal. Each RAM cell pair bridges both columns of RAM cells. Each column of RAM cells has a corresponding pair of bit lines, and each individual RAM cell is coupled to the bit lines by a word line circuit. Although each of the two RAM cells in a RAM cell pair are individually connected to distinct bit line pairs, the connection is accomplished concurrently by a common word line signal. When the word line signal is asserted for any one RAM cell pair, then no other word line signal is simultaneously asserted for any other RAM cell pair.

The word line signal for each of the RAM cell pairs is driven by an N-NARY address gate (or group of N-NARY address gates) that selectively asserts word line signals as a function of an address signal. The address gate is quite simple, quite small, and quite fast as compared to other word line signal drivers. The received address signal may be an N-NARY signal, or may be a collection of N-NARY signals. The output of the N-NARY address gate (or collection of N-NARY address gates) has a distinct output wire for each row of RAM cells in the RAM circuit, each row having one RAM cell in each of several columns, and responds to the address by providing a 1-of-N (N-NARY) output signal over the output wires. Each of the wires of the 1-of-N output signal from the N-NARY address gate is therefore connected to a distinct RAM cell pair, and only one word line signal may be asserted at any given time.

The N-NARY address is also provided to a SENSE signal generation circuit that performs a logical (Boolean) OR upon the N-NARY signal within the address signal. If there are multiple N-NARY address signals, the results of ORing each N-NARY signal are further ANDed. The SENSE signal generation circuit provides a sense amplifier trigger signal whose delay is a function of the latest arriving input address, rather than a direct function of clock timing. The SENSE signal generation circuit, therefore, corrects itself for any delays in the arrival of the address signal with respect to the clock timing. Moreover, delays do not have to be based on a "worst case" scenario of maximum tardiness in the arrival of the address, allowing the RAM circuits to take full advantage of early address arrival. Providing a logical AND-OR of these possible input addresses ensures that the sense amplifier trigger signal is not asserted until the required addresses are available for word line generation. According to a second aspect of the present invention (useful only in circuits having a very few word lines), rather than relying on address signals for the logical OR, the word line signals themselves are used in a logical OR for triggering the SENSE signal generation circuit. The sense signal may be further delayed from the address arrival time by delays that reflect the bit line evaluation time, so that the sense signal timing is more closely matched to the bit line evaluation time.

Finally, the present invention also includes an output circuit that provides both true and complemented values of output data without the need for any latches. Thus, the output drives subsequent N-NARY logic signals without the need for conversion. However, if a different signal width is desired, such as a signal width of 1 of 4 rather than a signal width of 1 of 2, then the two bit line pairs may be combined in a very simple output circuit. Moreover, the output circuit may be implemented by incorporation into the subsequent N-NARY logic gate directly without the need for signal width conversion or latching.

Additionally, according to one aspect of the present invention, the N-NARY RAM circuit provides both bit lines of each RAM cell column (that is, of each sense amplifier) to an output driver. In the vocabulary of N-NARY signals, each sense amplifier provides a 1-of-2 signal rather than merely a single bit line to the subsequent device. Bit line pairs may themselves be paired into groups of four bit lines, and easily converted to a 1 of 4 or other N-NARY output signal protocols. According to one aspect of the present invention, these signals are directly integrated into subsequent N-NARY logic gates. The present invention therefore contemplates a highly integrated structure, in which the design of the RAM circuit may be optimized for other logic circuits that read and write data.

DESCRIPTION OF THE DRAWINGS

To further aid in understanding the invention, the attached drawings help illustrate specific features of the invention and the following is a brief description of the attached drawings:

FIGS. 3-1 and 3-2 shows an address detection circuit as used in FIG. 3.

DETAILED DESCRIPTION OF THE INVENTION

The present invention is a method and apparatus for a RAM circuit that may be used with conventional logic or with N-NARY logic. Additionally, the present invention is a method and apparatus of a RAM circuit with an address trigger. This disclosure describes numerous specific details that include specific encodings, structures, circuits, and logic functions in order to provide a thorough understanding of the present invention. One skilled in the art will appreciate that one may practice the present invention without these specific details.

N-NARY LOGIC

RAMs are a critical part of any performance oriented architecture. They provide efficient storage, and act as buffers to allow flexible latencies between computational operations. In many static CMOS design styles, RAMs are designed independently of functional logic. Many static CMOS design styles require synchronization clocks that can delay data retrieval by a full clock cycle after data are ready. In the N-NARY design style, however, RAMs are little more than topologically unusual N-NARY gates, which give them a powerful performance advantage. The critical information propagation path is totally unencumbered from synchronization requirements. Once an input signal arrives, the RAM can begin retrieving data.

The core of a RAM consists of small memory elements packed as densely as possible, with near 100% utilization of the device and the lower routing layers. One of the aspects of the N-NARY design style is the way that N-NARY logic gates interface with a RAM. One of N input signals can directly couple to the inputs of a logically wide N-NARY word line driver gate, and the outputs from the RAM are directly compatible with N-NARY gates of the proper clock phase. Both the word lines and the internal SENSE pulse can be derived from the 1 of N inputs without a clock setup time requirement. A 1 of N signal is encoded so that at most one of its N wires is always at a logic "one."

Figure 6:
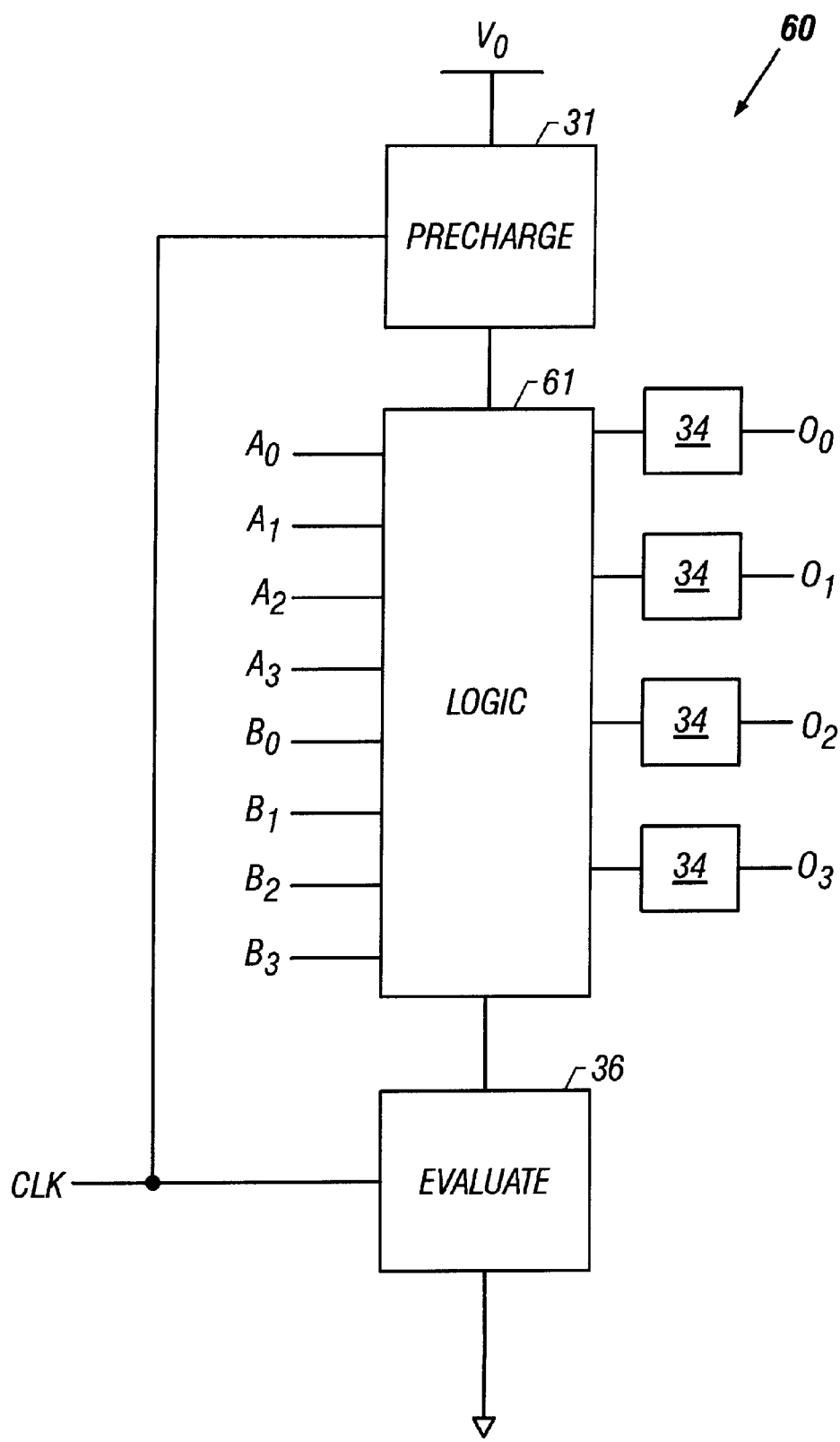
FIG. 6 is a block diagram of an embodiment of an N-NARY logic circuit that uses 1 of 4 signals.

FIG. 6 illustrates a circuit of N-NARY logic using two sets of 1 of 4 signals for the input signals and a 1 of 4 signal for the output signal. This circuit describes a 2 bit logic gate (a dit) where a is a 2 bit input, b is a 2 bit input, and o is a 2 bit output. In other words, a dit device produces 2 output bits. A device 60 comprises a logic tree circuit 61, a precharge circuit 31, and an evaluate circuit 36. Coupled to the logic tree circuit is the 2 bit input signal a, which is a 1 of 4 signal that comprises a plurality of input values $A_0, A_1, A_2,$ and $A_3$ and their associated wires or logic paths using a 1 of 4 encoding. Additionally coupled to the logic tree circuit is the 2 bit input b, which is another 1 of 4 signal that comprises a plurality of input values $B_0, B_1, B_2,$ and $B_3$ and their associated wires or logic paths using a 1 of 4 encoding. Coupled to the logic tree circuit is the 2 bit output o, which is a 1 of 4 signal that comprises a plurality of output values $O_0, O_1, O_2,$ and $O_3$ and their associated wires or logic paths using a 1 of 4 encoding. The logic tree circuit 61 performs a logic function on a plurality of input signals that could comprise a variety of functions, for example, the Boolean logic functions AND/NAND, OR/NOR, or XOR/Equivalence. The logic tree circuit 61 comprises one or more FETs with the preferred embodiment of the logic tree circuit comprising N-channel FETs.

Coupled to the wires of the plurality of output signals are the output buffers 34 that aid in driving additional circuits that couple to the output signals. One embodiment of N-NARY logic uses an output buffer with an inverting function as the output buffer 34. Another embodiment of N-NARY logic comprises a non-inverting buffer as the output buffer. And, another embodiment of N-NARY logic does not use an output buffer; instead, the plurality of output signals couples directly to other circuits.

A precharge circuit 31 couples to the logic tree circuit 61 and precharges the dynamic logic of the logic tree circuit. The precharge circuit 31 comprises one or more FETs with the preferred embodiment of the circuit comprising P-channel FETs. Each evaluation path of the logic tree circuit has its own precharge P-FET. Coupled to the precharge circuit 31 is the clock signal CK. A low clock signal on CK will cause the FETS in the logic tree circuit 32 to charge when using P-channel FETs in the precharge tree circuit.

An evaluate circuit 36 couples to the logic tree circuit and controls the evaluation of the logic tree circuit. The evaluate circuit 36 comprises one or more FETs with the preferred embodiment of the circuit comprising a single N-channel FET. Coupled to the evaluate circuit 36 is the clock signal CK. A high clock signal on CK will cause the FETS in the logic tree circuit 32 to evaluate when using N-channel FETs in the evaluate circuit. If the logic function of logic tree circuit 61 performed an OR/NOR function as found in the circuit of FIG. 8, then the resulting truth table would be Table 1. The mapping of the 1 of 4 encoding for the output comprises a variety of truth tables other than the example above and is dependent on the circuit design. However, Table 1 illustrates that one and only one logic path of the 1 of N encoding has an active high value (or an active logic state) on it during a single evaluation cycle when the data signals are available. In FIG. 6, there are 2 sets of 1 of 4 signals for the input signals and a 1 of signal for the output signal. The present invention provides that the input or output signals may have multiple sets of 1 of N signals using 1 of N encoding. For example, in each state in Table 1 for the input wires or logic paths $A_0$ through $A_3$, there is one and only one input logic path or wire that has an active high value on it. In each state in Table 1 for the input logic path $B_0$ through $B_3$, there is one and only one input logic path or wire that has an active high value on it. In each state in Table 1 for the output logic paths $O_0$ through $O_3$, there is one and only one output logic or wire path that has an active high value on it.

Figure 7A:
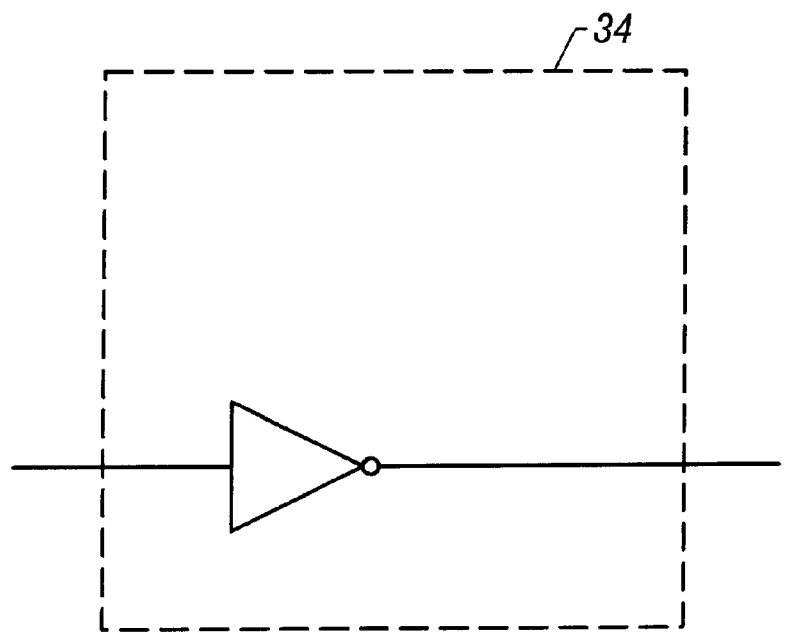
FIGS. 7A and 7B illustrate alternative circuit layouts for output buffers as used in N-NARY logic.
Figure 7B:
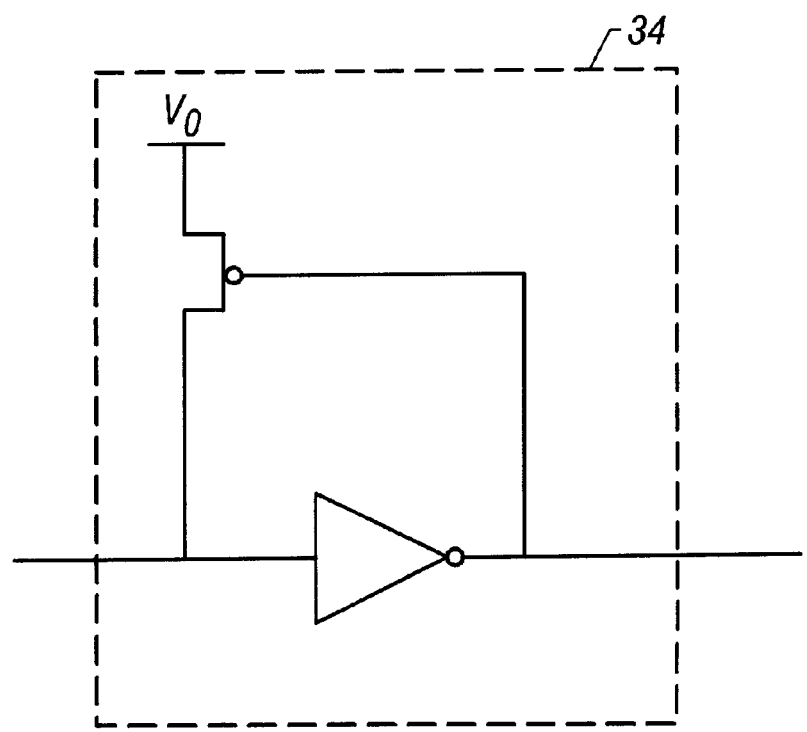

FIGS. 7A and 7B illustrate alternative circuit layouts for output buffers. FIG. 7A shows a CMOS inverter for inverting the signal on an output logic path. FIG. 7B shows the preferred embodiment of an output buffer that shows a CMOS inverter for inverting the signal and a feed back keeper transistor for maintaining the level of the dynamic node before the signal evaluates, which gives a logic gate using this buffer a static capability. Additionally, this type of output buffer compensates for parasitic leakages and allows for low speed functionality.

Figure 8:
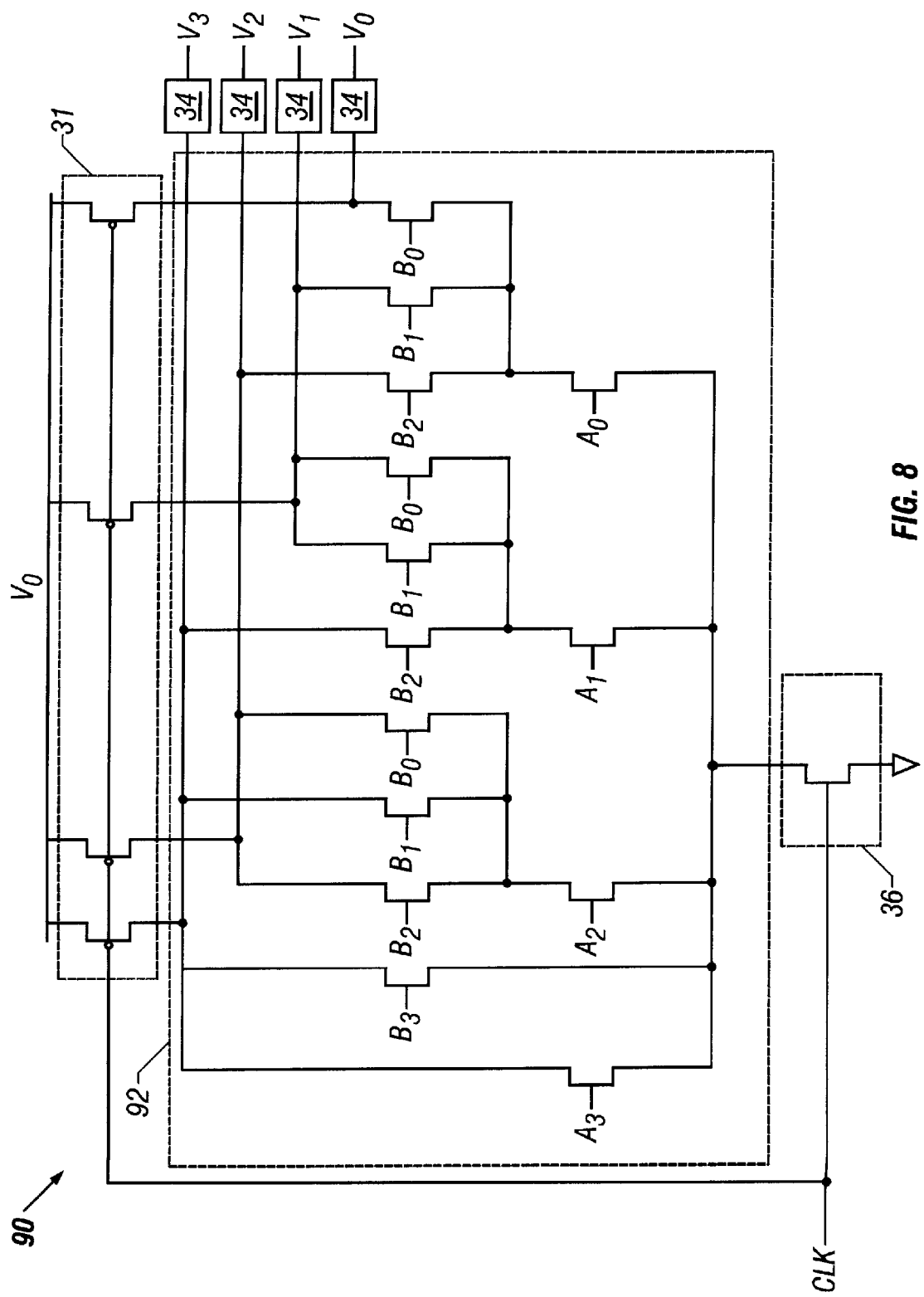
FIG. 8 is a circuit diagram of an N-NARY logic device for the OR/NOR function.

FIG. 8 is a circuit diagram for the OR/NOR function using N-NARY logic and a 1 of 4 encoding. One skilled in the art will appreciate that one function is the inverse of the other function. A device 90 is a dit (a 2 bit) device that has two 2 bit inputs and a 2 bit output that comprises a precharge circuit 31, an evaluate circuit 36, and a logic tree circuit 92. One of the 2 bit input signals comprises a 1 of 4 signal with a plurality of input values $A_0$, $A_1$, $A_2$, and $A_3$ and their associated wires that couple to the logic tree circuit 92 using a 1 of 4 encoding. The other 2 bit input comprises a 1 of 4 signal with a plurality of input values $B_0$, $B_1$, $B_2$, and $B_3$ and their associated wires that couple to the logic tree circuit 92 using a 1 of 4 encoding. A 1 of 4 signal with a plurality of output values $V_0$, $V_1$, $V_2$, and $V_3$, and their associated wires for the 2 bit output couple to the logic tree circuit 92 using the 1 of 4 encoding. Each output signal may comprise an inverting output buffer 34 on the associated wires of the signal. To reduce adding additional capacitance to the device, N-NARY logic uses a single, shared logic tree with multiple evaluation paths for evaluating the function of the logic circuit and for generating the plurality output signals coupled to the logic circuit.

The precharge circuit 31 has a plurality of P-FETs to quickly and fully precharge all of the dynamic logic in the logic tree circuit during the precharge phase of the clock cycle with each evaluation path of the logic tree circuit having its own precharge P-FET. Coupled to the precharge circuit 31 is a clock signal CK. When the clock signal is low, the precharge tree circuit 31 precharges the N-FETs in the logic tree circuit 92.

The evaluate circuit 36 has a single evaluation transistor, which aids in the speed of the clocking of the device and helps avoid races between other devices. Other circuits may use multiple evaluation devices. Coupled to the evaluate circuit 36 is the clock signal CK. When the clock signal is high, the evaluate circuit 36 evaluates the logic tree circuit 92.

The maximum stack height of this circuit is 2 transistors. For example, the transistors $B_2$ and $A_2$ reside on one evaluation path. The transistor $A_3$ on an evaluation path is an example of a stack height of 1.

The logic tree circuit 92 of this circuit performs the OR/NOR logic function with the following output table for the OR function:

TABLE 1

| $A_3$ | $A_2$ | $A_1$ | $A_0$ | $B_3$ | $B_2$ | $B_1$ | $B_0$ | $V_3$ | $V_2$ | $V_1$ | $V_0$ |
|---|---|---|---|---|---|---|---|---|---|---|---|
| 0 | 0 | 0 | 0 | 0 | 0 | 0 | 0 | 0 | 0 | 0 | 0 |
| 0 | 0 | 0 | 1 | 0 | 0 | 0 | 1 | 0 | 0 | 0 | 1 |
| 0 | 0 | 0 | 1 | 0 | 0 | 1 | 0 | 0 | 0 | 1 | 0 |
| 0 | 0 | 0 | 1 | 0 | 1 | 0 | 0 | 0 | 1 | 0 | 0 |
| 0 | 0 | 0 | 1 | 1 | 0 | 0 | 0 | 1 | 0 | 0 | 0 |
| 0 | 0 | 1 | 0 | 0 | 0 | 0 | 1 | 0 | 0 | 1 | 0 |
| 0 | 0 | 1 | 0 | 0 | 0 | 1 | 0 | 0 | 0 | 1 | 0 |
| 0 | 0 | 1 | 0 | 0 | 1 | 0 | 0 | 1 | 0 | 0 | 0 |
| 0 | 0 | 1 | 0 | 1 | 0 | 0 | 0 | 1 | 0 | 0 | 0 |
| 0 | 1 | 0 | 0 | 0 | 0 | 0 | 1 | 0 | 1 | 0 | 0 |
| 0 | 1 | 0 | 0 | 0 | 0 | 1 | 0 | 1 | 0 | 0 | 0 |
| 0 | 1 | 0 | 0 | 0 | 1 | 0 | 0 | 1 | 0 | 0 | 0 |
| 0 | 1 | 0 | 0 | 1 | 0 | 0 | 0 | 1 | 0 | 0 | 0 |
| 1 | 0 | 0 | 0 | 0 | 0 | 0 | 1 | 1 | 0 | 0 | 0 |
| 1 | 0 | 0 | 0 | 0 | 0 | 1 | 0 | 1 | 0 | 0 | 0 |
| 1 | 0 | 0 | 0 | 0 | 1 | 0 | 0 | 1 | 0 | 0 | 0 |
| 1 | 0 | 0 | 0 | 1 | 0 | 0 | 0 | 1 | 0 | 0 | 0 |

N-NARY logic signals

N-NARY logic signals have multiple wires and are often implemented on physical "tracks." In n-gate N-NARY logic, all of the wires carry a logic-level low voltage as an unasserted signal, except for zero or one wire per track which carries a logic-level high voltage as an asserted signal. The various wires in a track are generally used to gate NMOS FETs in an "n-gate tree" in such a manner as to ensure that at most one such NMOS FET (the selected "n-gate") provides a source-to-drain path. When the number of wires in a track is four, then the value carried on the track is referred to as a "1 of 4" value or a "dit" because four such wires can encode 2 bits, or a dual-bit, worth of information.

N-NARY Logic Gates

The RAM circuit of the present invention takes advantage of several features of N-NARY logic, operating at greater speed, with more predictable timing and a simpler structure than similar structures in static CMOS technologies. These advantages are largely achieved by using 1-of-N logic signals over parallel wires forming tracks. Among the signals carried over a track, at most one signal is asserted at a time. In other words, at most one wire within a physical track carries a value that is associated with a logical-True state. Although N-NARY logic signals have more wires than similar circuits in static CMOS technology, the resulting circuits are far simpler, use fewer transistors, occupy less space, and are faster than their static-CMOS counterparts.

N-NARY logic gates are implemented as paths from nodes that are outputs of an "N-gate tree" (also called top-of-stack, or TOS, nodes) of NMOS FETs, to a virtual ground node. Each of the wires belonging to the set of TOS nodes is subsequently individually inverted in an output driver. Each of the paths in a N-gate tree is comprised of a series of NMOS FETs, each gated by a wire belonging to the track of a different input. There is generally only one path that is activated between the set of TOS nodes and ground. In an N-NARY design, the evaluate clock (for example, signal CLK in FIG. 8) is asserted before the input signals are asserted. Since the not-asserted state of the input signals is all zeros, the N-NARY gate does not evaluate until the inputs assert. In this way, the assertion time of the N-NARY gate output is a function of the input arrival times, not the clock arrival time.

RAMs

Figure 1:
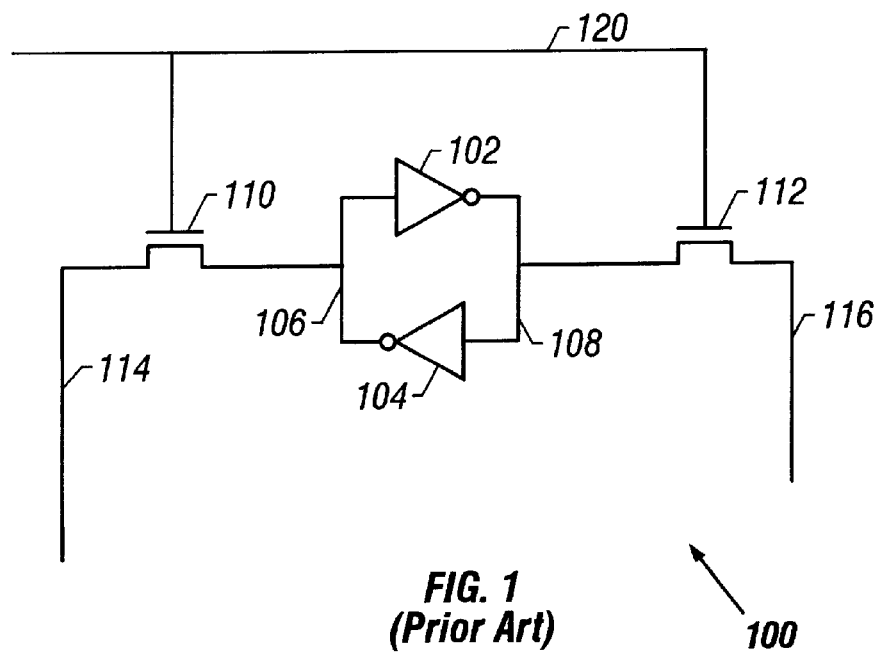
FIG. 1 shows a prior art RAM cell for storing a one-bit value and its complement.

FIG. 1 illustrates a prior art RAM cell 100 that is used as part of the present invention. The RAM cell 100 contains a pair of inverters 102 and 104 connected in usually complementary directions between two nodes 106 and 108. A pair of word line transistors 110 and 112 form a word line circuit connecting the pair of nodes 106 and 108 to a pair of bit lines 114 and 116. The word line transistors 110 and 112 are gated by a word line signal 120 that controls whether the pair of nodes 106 and 108 are electrically connected to the pair of bit lines 114 and 116.

As shown in FIG. 1, gate 110 and gate 112 are each an N-MOS FET. When word line signal 120 is asserted with the voltage that exceeds the threshold voltage of the n-gate transistors 110 and 112, during a read operation, the voltage of the internal nodes 106 and 108 are applied to the bit lines 114 and 116, respectively. During a write operation, when sufficient charge is provided to the bit lines 114 and 116, the assertion of the word line signal 120 applies a voltage and stores a charge on the internal nodes 106 and 108 via the word line transistors 110 and 112, respectively.

Sense Amplifiers

Figure 2:
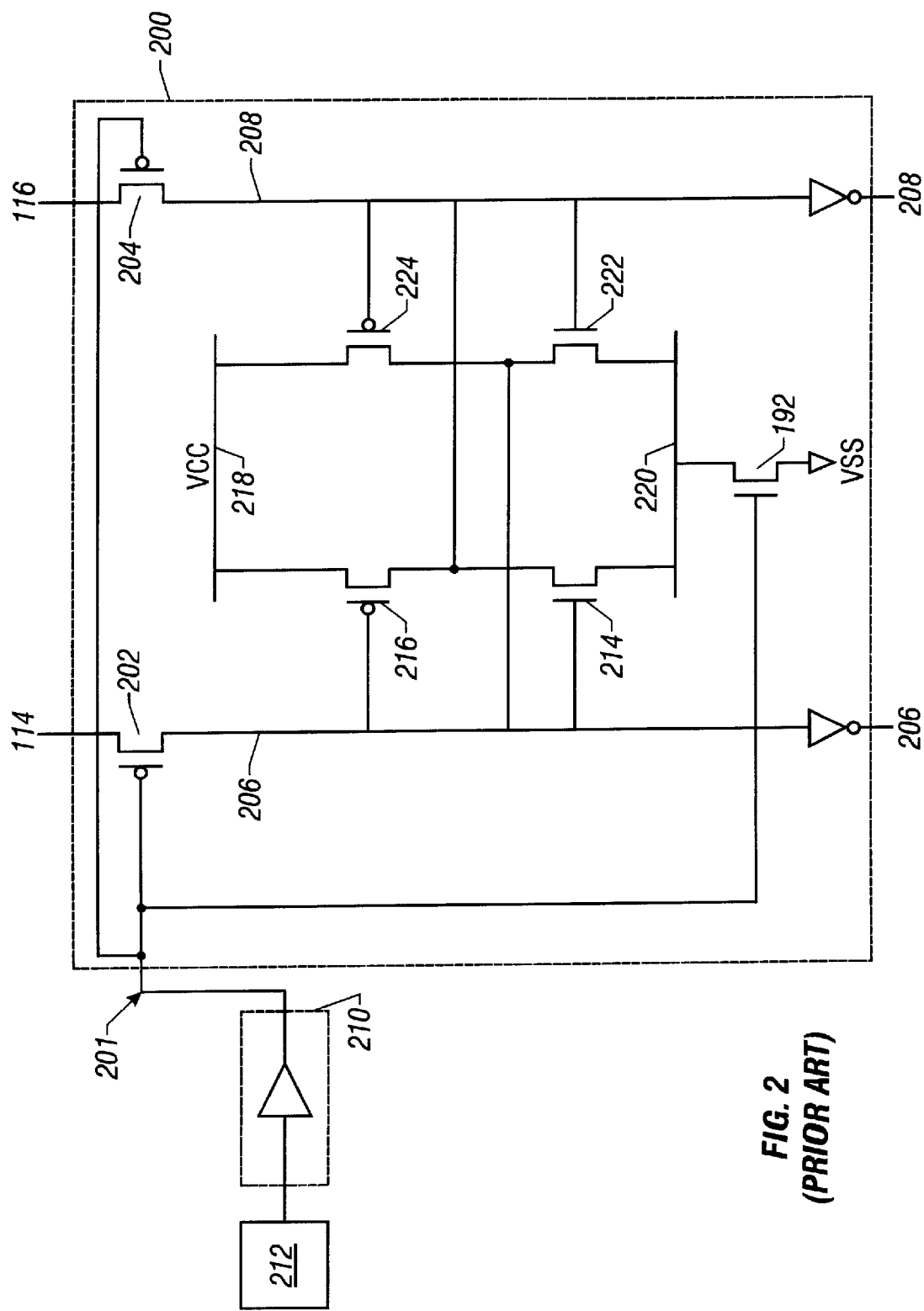
FIG. 2 shows a portion of a prior art memory circuit and a sense amplifier circuit.

FIG. 2 illustrates a prior art sense amplifier 200 that is used in the present invention. A pair of bit lines 114 and 116 are connected via a sense drive circuit 200 to a pair of output bit lines *OUT 206 and OUT 208. The gate terminals of transistors 202, 204 and 192 are gated by a sense amplifier trigger signal 201. The sense amplifier trigger signal is generated by a delay circuit 210 that asserts the sense amplifier trigger signal upon a delay following a particular edge of a clock signal 212. Often, this delay includes a component that models the delay of the word line and RAM bit line.

The sense amplifier is designed to amplify slight voltage differences between the two bit lines 114 and 116. However, this is very problematic when the sense amplifier triggers before data has been applied to the bit lines, i.e. when the bit lines carry spurious differences resulting from noise, crosstalk, or previous data. Since the sense amplifier responds to even small differences between the lines 114 and 116, a trigger circuit 212 (such as the sense generation circuit 320 of FIG. 3) is provided to the sense amplifier circuit through a delay circuit 210. The trigger circuit ensures that the sense amplifier does not sense bit lines 114 and 116 until the trigger circuit 212 and the delay circuit 210 have given the address bits (not shown in FIG. 2) sufficient time to drive a word line signal and for sufficient charge to accumulate on bit lines 114 and 116 (FIG. 1). The delay circuit 210 is designed to have enough delay to allow the bit lines 114 and 116 to develop sufficient differential voltage. The signals 206 and 208 may drive N-NARY gates or other logic directly.

Word Line Driver

Figure 3A:
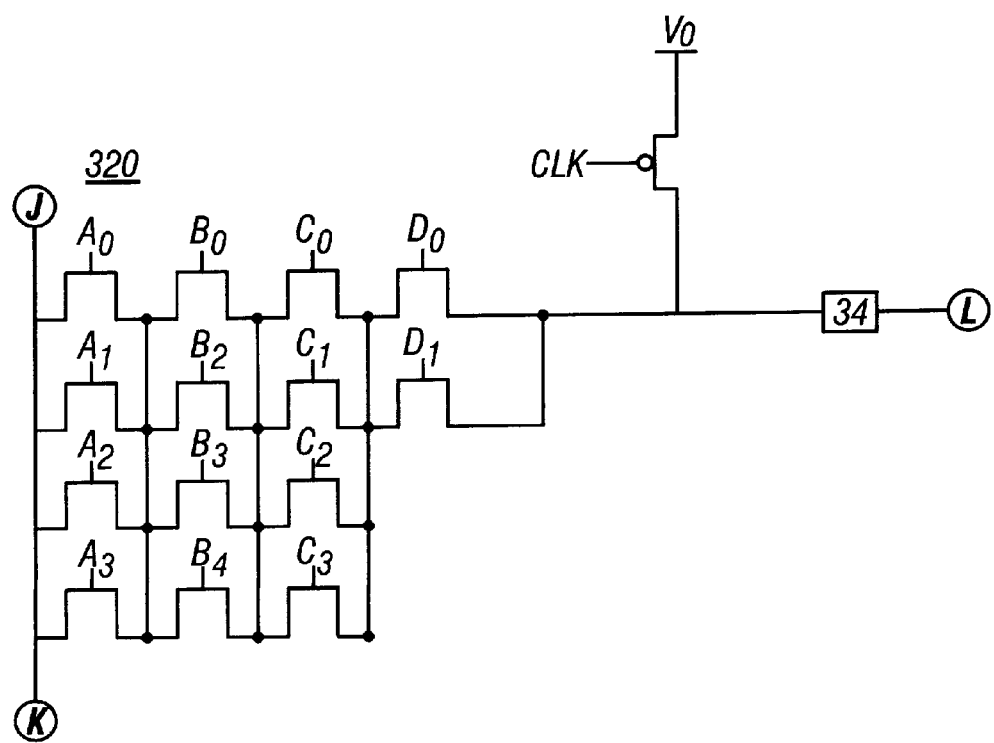
FIG. 3 shows an N-NARY RAM circuit according to a first embodiment of the present invention.
Figure 3B:
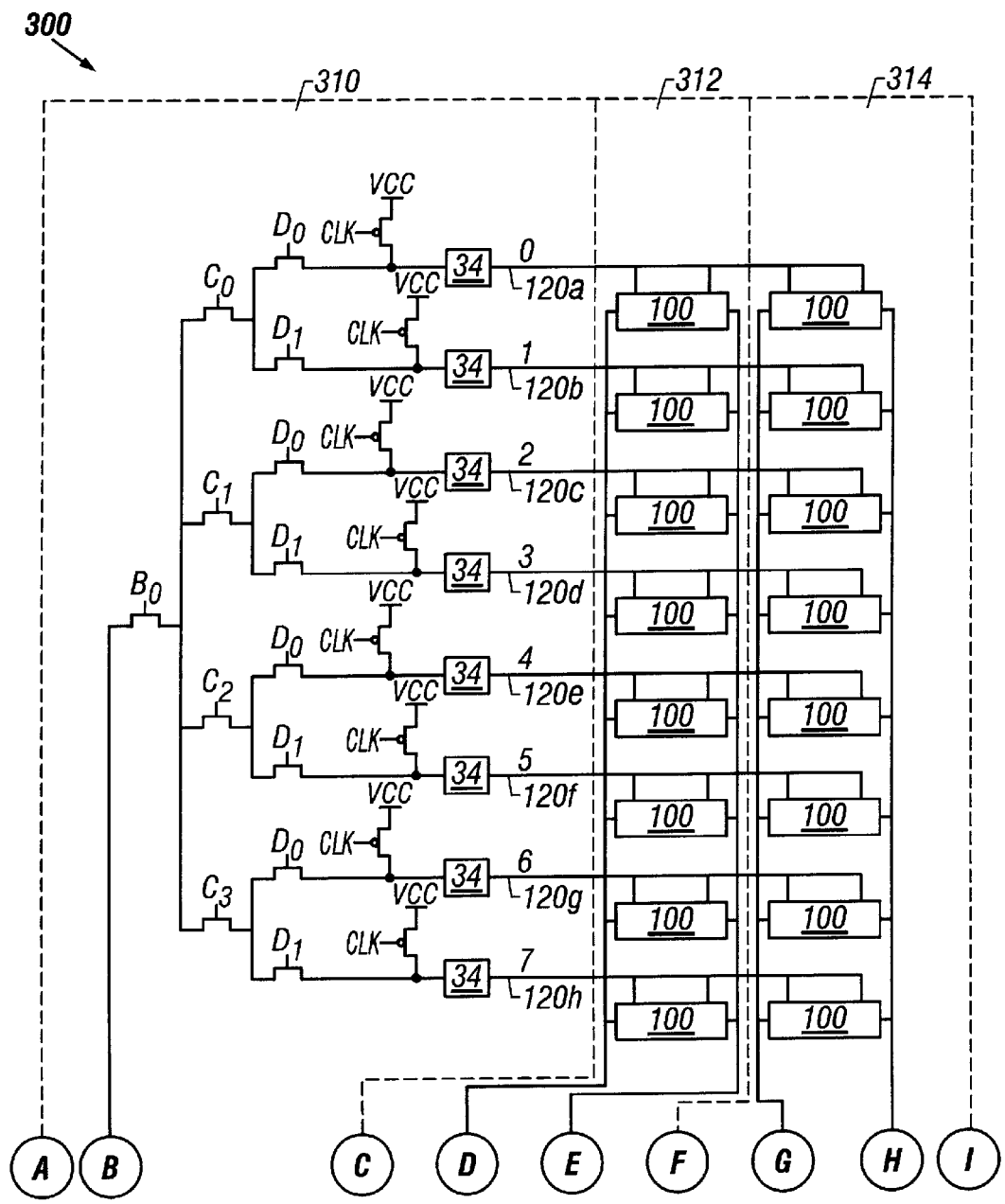
Figure 3C:
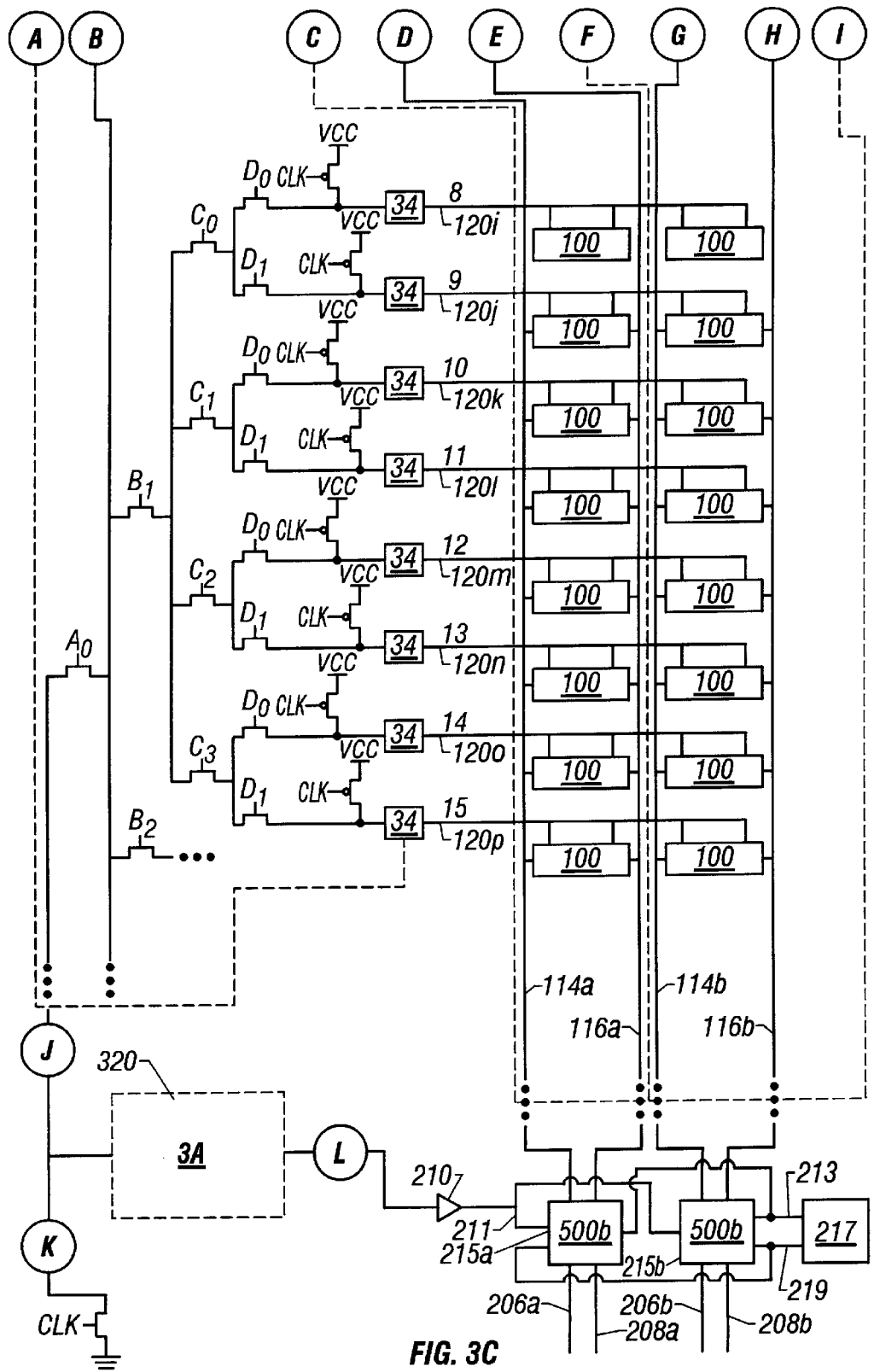

FIG. 3-1 illustrates several important features of a RAM circuit 300 of the present invention with 128 rows designed to the N-NARY style. The word line driver is constructed from a single N-NARY gate that receives four input signals, A, B, C and D, three of which are 1 of 4 encoded (A, B, C) and one of which is 1 of 2 encoded (D). Therefore, 1 of 4 signal A has the values 0, 1, 2 and 3, 1 of 4 signal B has the values 0, 1, 2 and 3, 1 of 4 signal C has the values 0, 1, 2 and 3, and 1 of 2 signal D has the values 0 and 1. Each signal also has the null value; that is when no wires of the signal assert. If the input signals are expected to arrive at different times, the A input is chosen to be the first available, and D is chosen to be the last. In this way, the evaluate tree will start discharging from the bottom such that the node between the C and D inputs is already discharging when the D input finally arrives. There is no input latch required since the proper word line is known once all four of the inputs have arrived, and this cell ensures that no word line is driven until such time. Inverter word line drivers exist on each output to drive the large capacitance on each word line, similar to the output driver of a normally sized N-NARY gate. Each evaluate node requires precharging. Additionally, depending on the physical layout and process technology, intermediate nodes in the N-gate tree may require precharging.

The charge flow in this gate is reasonable despite its size, and provides an excellent example of effective capacitance isolation. For example, an exemplary path including transistors $A_0$, $B_0$, $C_1$, and $D_1$ collectively select word line 120d. Transistor $A_0$ is a transistor gated by a wire belonging to 1-of-N input signal A. The wire gating transistor $A_0$ is active, and turns transistor $A_0$ on when A has a 1-of-N value of 0 (1-of-N). Similarly, transistor $B_0$ is a transistor gated by a wire belonging to 1-of-N input signal B, and is turned on when the signal B has a value of 0 (1-of-N). Transistor $C_1$ is gated by a wire belonging to 1-of-N input signal C, and is turned on when the signal C has a value of 1 (1-of-N). Transistor $D_1$ is gated by a wire belonging to 1-of-N input signal D and is turned on when the signal D has a value of 1 (1-of-N). It should be noted that although the input signals are all described as 1-of-N, in fact the various input signals might differ in width, i.e., the number of wires used to implement each signal. The above example of wires and transistors show one possible input value and what capacitances result in power being consumed. The nodes that actually evaluate have just four on transistors and seven off transistors, though a significant length of wire separates many of the transistors. Even so, the capacitance on the longer computational nodes are significantly less than the gate capacitance on the P-channel word line driver, which limits, and possibly eliminates the need to precharge internal computational nodes.

The N-NARY RAM circuit

FIG. 3-2 illustrates one embodiment of the present invention that comprises an N-NARY RAM circuit 300. The N-NARY RAM circuit 300 includes an improved word line generation circuit 310, also referred to as the word line driver, which ensures that at most one word line signal is asserted at any given time. Additionally, the N-NARY RAM circuit 300 includes multiple columns (312 and 314, for example) of RAM cells 100, each cell being triggered by word lines 120A–120P. Each word line signal 120A–120P triggers multiple RAM cells; each RAM cell triggered being individually coupled to a different bit line pair.

Also shown in FIG. 3, each word line signal 120A–120P is driven by an output of the N-NARY word line generation circuit 310. The word line driver for the entire N-NARY RAM circuit comprises a single N-NARY gate having a 1-of-N output. The N-NARY gate receives the address as a number of 1-of-N address signals, and implements each 1-of-N address portion as a tier of transistors. Due to the use of an N-NARY gate for dynamic address input, the word line driver responds much more quickly and with less chance of accidentally triggering a word line signal than the prior art. Furthermore, there is no setup time required of the input address relative to the clock, providing the address arrives during the evaluate period of the word line generation circuit.

Other variations on the word line drive in this invention are possible. For example, rather than a single, large N-NARY gate driving all the word lines, the word lines may be driven by multiple, smaller N-NARY gates. The benefits of the address detection method described next are retained.

The N-NARY SENSE signal generation circuit

Figure 5:
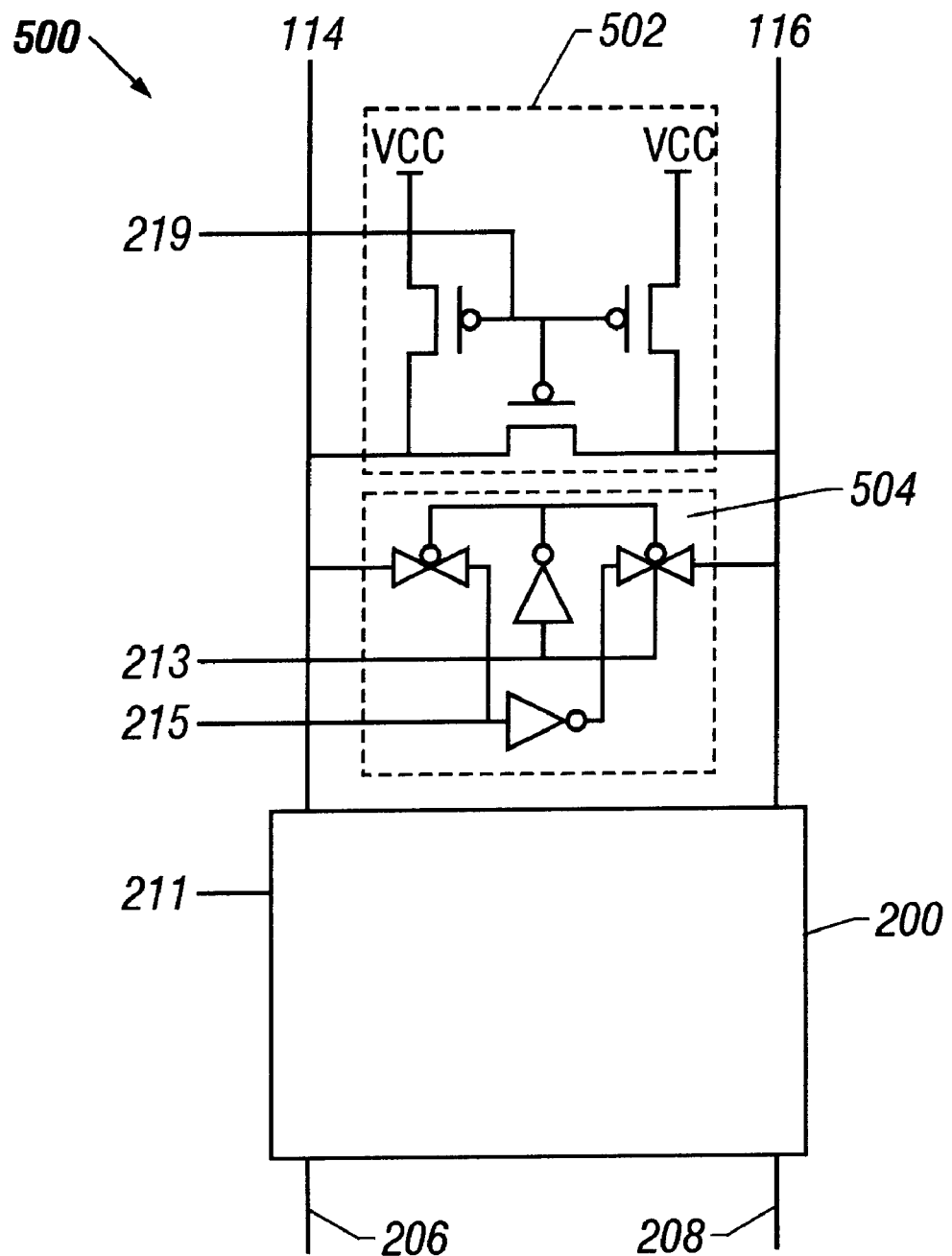
FIG. 5 shows column read/write logic according to the embodiment of FIGS. 3-1 and 3-2.

FIG. 3-2 illustrates the use of a pair of sense amplifiers 500a and 500b. Each bit cell 100 is gated onto true and false bit lines (114a, 116a and 114b, 116b, respectively) through a pair of small N-channel devices (shown in FIG. 1) controlled by the word line driver 310 passing over the individual cells 100. Since this N-channel device is small, it has difficulty driving the bit lines 114a, 116a and 114b, 116b quickly, and to compensate, a sense amplifier 500 of FIG. 5 is constructed to produce full-swing outputs when just a small difference or differential is detected between the true and false bit lines 114a, 116a and 114b, 116b. The sense amplifier places a restriction on the RAM design in that the bit cells must drive a sufficient voltage differential on the bit lines 114a, 116a and 114b, 116b before any attempts are made to sense it. If the bit lines are not sufficiently driven, or if they are not driven at all, the sense amplifier will detect a potentially erroneous value. This is solved by providing a signal to the sense amplifier to indicate when the bit lines are expected to have adequate differential. An important advantage to the N-NARY logic style is the means where this SENSE signal is generated. In more traditional CMOS designs, the signal is generated as a delay from the clock, and the address to this RAM is required to have a specific setup time to the clock. This setup time represents the point in time relative to the clock when the address must be valid. With N-NARY design, the clock does not directly determine the SENSE signal generation time as a result of the logic's self-timing feature of the signals. These features help eliminate penalties associated with clock skew, jitter, and functional granularity. Therefore, a sense generation gate 320 is constructed that asserts the SENSE signal 211 at a delay circuit 210 after all inputs have arrived.

In cooperation with the SENSE signal 211, a write data signal (WRDATA) 215 controls when data is written to the columns in the RAM circuit 300. The write data signal couples separately to the sense amplifiers 500a and 500b.

Driving the SENSE signal 211 from the address inputs (the 1 of 4 signals A, B, C, and the 1 of 2 signal D), as performed by sense generation circuit 320, conforms to the normal N-NARY gate behavior where outputs are driven shortly after the inputs arrive, and as a function of the input arrival time. The SENSE signal generation need not occur in response to a clock edge, and should be distinguished from the precharge signal of dynamic N-NARY gates. The RAM circuit 300 also has precharge and evaluate devices as can be seen in the large word line driver gate. An additional precharge function (provided by the column precharge circuit 502 of FIG. 5) is commonly used to precharge and "equilibrate" the bit lines prior to sensing the next read value. There is some timing uncertainty because the sense signal must be generated in parallel to the bit line evaluation path, and must account for possible variations between these parallel paths, but the present invention avoids the additional and costly timing uncertainty due to clock variations.

The actual gate used to detect signal arrival time is a novel one. The sense generation gate circuit 320 of FIGS. 3-1 and 3-2 is an example of such a gate. Each of the N-NARY input signals couples to a level in the gate in the same arrangement as it does in the word line driver gate, but in this case each signal has its two or four wires OR-ed together. Each gate level discharges the node above it once one of its input wires is asserted. The best way to think of this is that the operation of ORing all the values of a signal together produces a logically meaningless result, but one which is very meaningful from a synchronization viewpoint. Once one wire of each level is asserted, the RAM circuit 300 discharges its only top of stack node and indicates that the entire address is present (in other words, in the presence of a valid address). Arranging the inputs in the same way as in the word line driver gate eliminates some of the sources of uncertainty between the sense generation circuit 320 and the word line driver circuit 310. If necessary, the sense signal 211 can be delayed by means of delay circuit 210 to allow adequate differential on the bit lines to be developed.

Additionally, the RAM cell circuit 300 comprises a sense amp control logic circuit 217. The sense amp control logic circuit 217 generates a write signal (WR) 213 that when active (i.e., the SENSE signal 211 is low) allows the write data to be gated on to the bit lines signals 114A and 116A and the bit lines 114B and 116B of the sense amplifier 500b. The sense amp control logic circuit 217 additionally generates a precharge signal *PRE 219, which controls the bit line precharge for the cells in the RAM circuit 300.

Finally, the outputs from a RAM circuit of FIG. 3-2 may be connected directly to N-NARY gates. A sense amplifier naturally generates the true and complement of the value it reads, which conforms to a 1 of 2 N-NARY signal encoding. Since both polarities of data are high going, they can directly drive an N-NARY gate of the proper precharge/evaluate phase. No output latch is required.

Outputs

Figure 4:
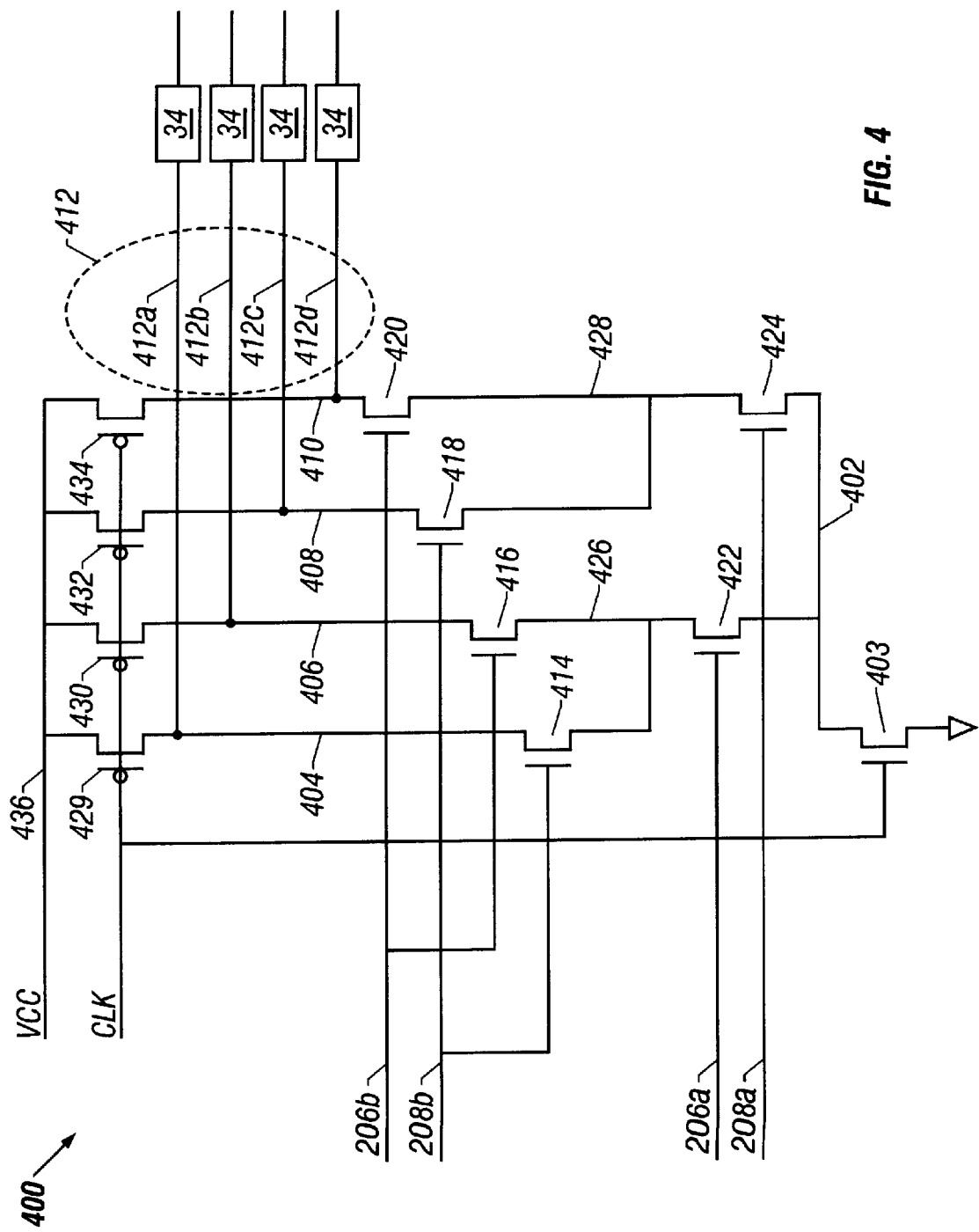
FIG. 4 shows an N-NARY logic gate.

FIG. 4 illustrates one embodiment of an output circuit of the present invention. The circuit of FIG. 4 may be considered a multiplexer driven by the signals of one sense amplifier 500a and having data inputs of a second sense amplifier 500b (both from FIG. 3-2). The arrangement of the transistors gated by the signals from bit lines 206a and 208a, in combination with the transistors gated by the signals from bit lines 206b and 208b, provide only one active path between the drain terminal of any transistor 414–420 and the virtual ground node 402. Transistors not part of the discharge path are turned off. This prevents multiple nodes from obtaining or losing charge while another node is switching, and thus reduces any cross talk among residual capacitance.

The output driver 400 of the RAM circuit 300 provides a 1 of 4 output appropriate for driving subsequent N-NARY logic gates. Although the output driver of the present invention may use more physical wires than prior art memory buses to communicate the same amount of information from the memory device to a memory controller, the resulting simplicity thereby made possible in the subsequent logic devices more than compensates for any loss in data transfer capacity.

FIG. 4 illustrates one embodiment of the present invention that comprises a 1 of 4 output circuit 400. It will be recognized that sense amplifier circuits traditionally make use of only one of two of the outputs available. The circuit 400 provides a 1 of 4 output having four physical wires 412a–412d, each having a path to a virtual ground node 402 that passes through two transistors in series. The inputs to the circuit 400 are obtained from the sense amplifiers 500a and 500b of FIG. 3-2.

As stated above, the first sense amplifier 500a of FIG. 3-2 provides two output signals on the pair of bit lines 206a and 208a. As shown in FIG. 4, this pair of bit lines gates transistors 422 and 424 such that one transistor is on and one transistor is off whenever a signal from the first sense amplifier is available. Since transistors 422 and 424 are gated by respective wires of a 1 of 2 signal, only one transistor may be on at any time. Therefore, the voltage at only one of nodes 426 and 428 may be switching at any given time. This "capacitive isolation" practically eliminates the crosstalk between nodes 426 and 428 and eliminates a large factor in the capacitance related delays and hazards of electronic circuits.

Similarly, since only one of bit lines 206b and 208b may carry a high voltage at any time, only one transistor of transistors 414 and 416 may be on at any time. Similarly, only one of transistors 418 and 420 may be on at any time. Therefore, through nodes 404, 406, 408, and 410, the output signal 412a–412d is a 1 of 4 signal where only one physical wire of four physical wires may carry an asserted signal at any given time. The circuit of FIG. 4 is also an example of clocked dynamic logic, having a precharge signal that is active when the evaluate clock is low. During a portion of the clock signal where the clock signal has a low voltage, the four physical wires belonging to the top-of-stack signals 412A–D of the circuit in FIG. 4 are connected via transistors 429, 430, 432, and 434 to a positive rail voltage VCC, labeled as rail 436. During a phase of the clock cycle where the clock signal is high, the transistors 414–424 select one of the four wires 412a–412d for connection to the virtual ground node 402, which is coupled to an evaluate transistor 403. The remaining wires of the 1 of 4 output signal remain at a high voltage retained from the previous portion of the clock cycle. After passing through the set of output drivers 34, the output signal of the circuit in FIG. 4 is a 1 of 4 signal.

RAMs constructed with sense amplifiers produce 1 of 2 outputs, which is not ideal for the N-NARY family that desires 1 of 4 dits. Recoding from 1 of 2 to 1 of 4 is necessary at the RAM outputs destination. Recoding requires two transistors arranged in series for each 1 of 4 value instead of just one. Since these transistors perform an AND function it is possible to use common source-drain N-active regions, which have a small cost. RAM outputs usually drive just one destination because, at least in high performance designs, they typically drive either an aligner or a bypass mux. This further reduces the cost of recoding their outputs, since the recoding typically needs to be done just once. (FIG. 4 shows a gate that recodes 1 of 4, but in typical implementation this function is performed as part of a larger function.)

FIG. 5 shows column read/write logic 500 as used in the RAM circuit 300 of FIG. 3. The circuit 500 comprises a sense amp 200 (as illustrated in FIG. 2), a column precharge circuit 502, and a write logic circuit 504. The column precharge circuit 502, the write logic circuit 504, and the sense amp 200 couple to the bit lines 114 and 116. In addition, the sense amp 200 provides the output bit lines OUT 208 and *OUT 206.

The write logic circuit 504 comprises a write data signal (WRDATA) 215 and a write signal (WR) 213. The write data signal (WRDATA) 215 controls what data is written to the columns in the RAM circuit 300. The write signal (WR) 213 when active allows the write data to be gated on to the bit lines 114 and 116. When (WR) 213 is active, sense (211) must be inactive.

The column or bit line precharge circuit 502 comprises a precharge signal (*PRE) 219. The precharge signal (*PRE) 219 is a signal that controls the bit line precharge for the individual cells 100 in the RAM circuit 300.

In summary, the present invention provides an improved RAM circuit through the use of N-NARY logic gates. The RAM circuit includes two columns of RAM cells, two pairs of bit lines, an N-NARY input logic circuit, a SENSE signal generation circuit, two sense amplifiers, and an output driver circuit. The sense signal generation circuit evaluates as soon as a valid address is available, without requiring that the address be set up to a clock edge. One portion of the RAM circuit includes one of the columns of RAM cells, one of the pairs of bit lines, and one of the sense amplifiers. A second portion of the RAM circuit includes the second column of RAM cells, the second of the pairs of bit lines, and the second sense amplifier. Each of the RAM cells is a static RAM cell, and together with a corresponding RAM cell in the other column forms a RAM cell pair that is driven by a common word line signal. Each RAM cell pair bridges both columns of RAM cells.

Other embodiments of the invention will be apparent to those skilled in the art after considering this specification or practicing the disclosed invention. The specification and examples above are exemplary only, with the true scope of the invention being indicated by the following claims.

We claim:

1. A method that uses a memory device, comprising:
   receiving a sense signal;
   in response to the sense signal, detecting a differential sense between a first pair of bit lines; and
   providing an N-NARY 1-of-N output signal representing the differential sense, wherein N is at least two.

2. The method of claim 1, further comprising:
   in response to the sense signal, detecting a differential sense between a second pair of bit lines; and
   updating the N-NARY 1-of-N output signal representing the differential sense between the first pair of bit lines, to represent both the differential sense between the first pair of bit lines and the differential sense between a second pair of bit lines, wherein N is at least four.

3. A method to manufacture a memory device, comprising:
   providing a first plurality of storage cells, each storage cell storing a first value and a negation of the first value;
   coupling a first bit line to the plurality of storage cells;
   coupling a second bit line to the plurality of storage cells;
   coupling a first sense amplifier device between the first bit line and the second bit line;
   coupling the first sense amplifier device to receive a sense signal, the first sense amplifier configured to detect a differential sense between the first bit line and the second bit line when a sense signal is received; and coupling an N-NARY output interface to provide an N-NARY 1-of-N output signal, wherein N is at least two, representing the differential sense.

4. The method of claim 3, further comprising:

providing a second plurality of storage cells within the memory device, each storage cell storing a second value and a negation of the second value;

coupling a third bit line to the second plurality of storage cells;

coupling a fourth bit line to the second plurality of storage cells;

coupling a second sense amplifier device to receive the sense signal;

coupling the second sense amplifier device between the third bit line and the fourth bit line, including coupling the second sense amplifier device to detect a differential sense between the first bit line and the second bit line when the sense signal is received; and coupling the third bit line and the fourth bit line to the N-NARY output interface to provide an N-NARY 1-of-N output signal, wherein N is at least four, representing the differential sense of the first sense amplifier device and the second sense amplifier device.

5. The method of claim 3, further comprising:

providing a subsequent logic device having a 1-of-N N-NARY input signal, the 1-of-N N-NARY input signal having N input wires corresponding to the 1-of-N N-NARY input signal; and coupling each of the output wires of the N-NARY output interface to a distinct one of the N input wires of the 1-of-N N-NARY input signal of the subsequent logic device.

6. The method of claim 5, further comprising:

providing a subsequent logic device having a 1-of-N N-NARY input signal, the 1-of-N N-NARY input signal having N input wires corresponding to the 1-of-N N-NARY input signal; and coupling each of the output wires of the N-NARY output interface to a distinct one of the N input wires of the 1-of-N N-NARY input signal of the subsequent logic device.

7. A method to manufacture a memory device, comprising:

providing a first plurality of storage cells;

coupling a first bit line to said plurality of storage cells;

coupling a second bit line to said plurality of storage cells;

coupling a first sense amplifier device between said first bit line and said second bit line, and further coupled to receive a sense signal, said first sense amplifier configured to detect a differential voltage between said first bit line and said second bit line when said sense signal is received; and providing an output interface comprising at least two output wires, the output wires including a first output wire coupled to said first bit line and a second output wire coupled to said second bit line, the output wires collectively providing an N-NARY 1-of-N output signal wherein N is at least two.

8. The memory device of claim 7, further comprising:

providing a second plurality of storage cells;

coupling a third bit line to said second plurality of storage cells;

coupling a fourth bit line to said second plurality of storage cells;

coupling a second sense amplifier device between said third bit line and said fourth bit line, and further coupled to receive said sense signal, said second sense amplifier configured to detect a differential voltage between said third bit line and said fourth bit line when said sense signal is received; and providing a third output wire and fourth output wire of the output interface, said third output wire coupled to said third bit line and said fourth output wire coupled to said fourth bit line, the output wires collectively providing an N-NARY 1-of-N output signal wherein N is at least four.

9. A method that uses a memory device, comprising:

configuring a first sense amplifier device coupled between a first bit line and a second bit line, and further coupled to receive a sense signal, said first sense amplifier configured to detect a differential voltage between said first bit line and said second bit line when said sense signal is received, and wherein said first bit line and second bit line are coupled to said plurality of storage cells; and providing an N-NARY 1-of-N output signal from an output interface comprising at least two output wires, the output wires including a first output wire coupled to said first bit line and a second output wire coupled to said second bit line, the output wires collectively providing said N-NARY 1-of-N output signal wherein N is at least two.

10. The method of claim 9, further comprising:

a second plurality of storage cells within the memory device;

a third bit line coupled to said second plurality of storage cells;

a fourth bit line coupled to said second plurality of storage cells;

a second sense amplifier device coupled between said third bit line and said fourth bit line, and further coupled to receive said sense signal, said second sense amplifier configured to detect a differential voltage between said third bit line and said fourth bit line when said sense signal is received; and a third output wire and fourth output wire of the output interface, said third output wire coupled to said third bit line and said fourth output wire coupled to said fourth bit line, the output wires collectively providing an N-NARY 1-of-N output signal wherein N is at least four.

* * * * *